United States Patent [19]

Allen, Jr. et al.

[11] 4,058,776

[45] Nov. 15, 1977

[54] BIAS CIRCUIT FOR AVALANCHE DIODES

[75] Inventors: Elmer Lawrence Allen, Jr., Philadelphia, Pa.; Hirohisa Kawamoto, Kendall Park, N.J.

[73] Assignee: RCA Corporation, New York, N.Y.

[21] Appl. No.: 709,925

[22] Filed: July 29, 1976

[51] Int. Cl.² ............................................. H03F 3/10
[52] U.S. Cl. ................................ 330/299; 330/296; 330/53; 330/199; 331/107 R
[58] Field of Search ............... 330/34, 53, 40, 199; 331/107 R

[56] References Cited

U.S. PATENT DOCUMENTS

| 3,792,375 | 12/1974 | Brackett | 331/107 R X |
|---|---|---|---|
| 3,882,420 | 5/1975 | Liu | 331/99 X |

*Primary Examiner*—Lawrence J. Dahl
*Attorney, Agent, or Firm*—Robert M. Rodrick; Joseph D. Lazar; H. Christoffersen

[57] ABSTRACT

A bias circuit for a large pulse-width, broad-bandwidth radio-frequency avalanche device comprising a power supply coupled to the device through a bias line. The bias circuit includes a resistive network shunted across the bias line and ground to dampen spurious submicrowave oscillations.

4 Claims, 1 Drawing Figure

U.S. Patent     Nov. 15, 1977     4,058,776
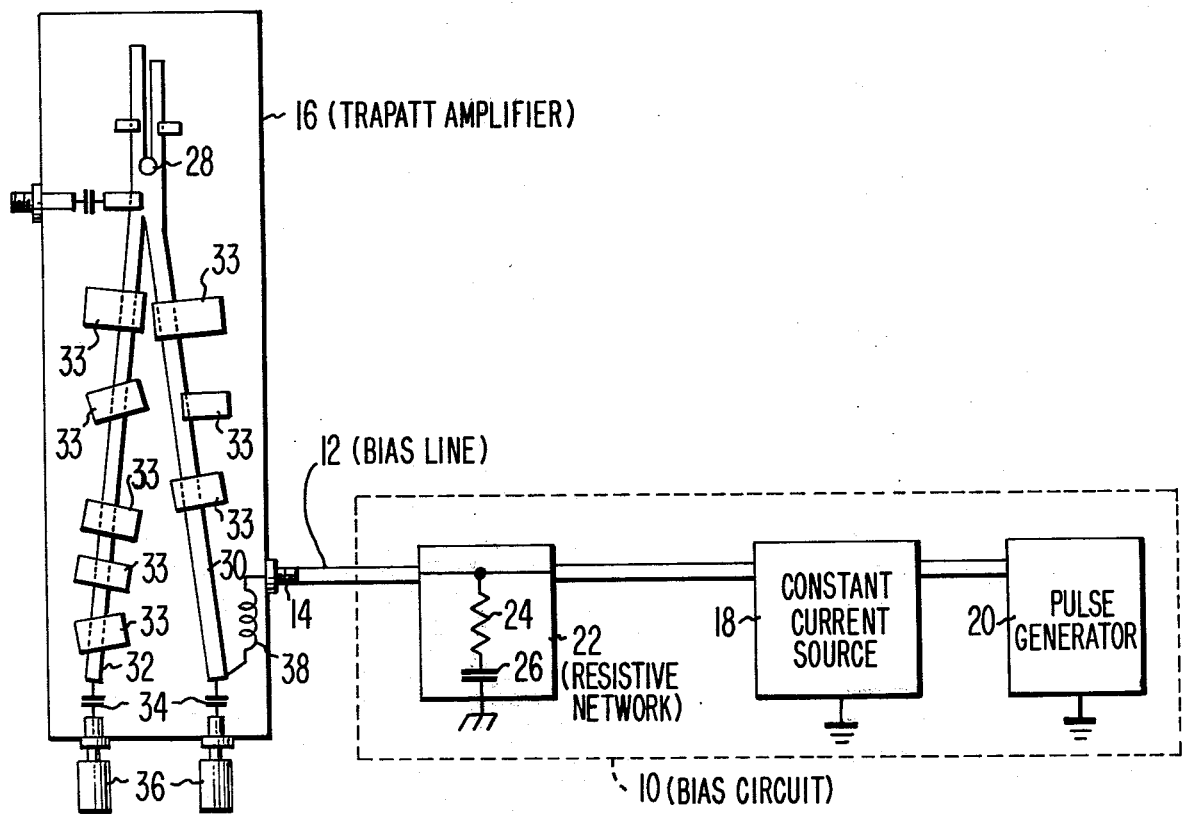

BIAS CIRCUIT FOR AVALANCHE DIODES

BACKGROUND OF THE INVENTION

1. Field of the Invention

The present invention relates to bias circuits for radio frequency avalanche diodes.

2. Description of the Prior Art

Amplifiers and oscillators utilizing biased avalanche devices, operate on the principle that an avalanche device exhibits a negative resistance at a desired microwave operating frequency. Typical microwave operating frequencies are in the order of 1.5 $GH_z$. However, avalanche devices typically also generate spurious sub-microwave oscillations.

Avalanche devices typically exhibit negative resistances at undesired sub-microwave frequencies, for example, at frequencies in the order of 100 $KH_z$ to 500 $MH_z$, as well as at the desired microwave frequency. If the impedance of the biasing network to the avalanche device presents an impedance match to the negative resistance at the low frequencies, spurious oscillations (hereinafter referred to as sub-microwave negative resistance oscillations) at such frequencies occur.

In addition, spurious relaxation-type oscillations, at frequencies (typically 50 $KH_z$ to 500 $KH_z$) dependent on the voltage swing across the avalanche device and the RC time constant of the circuit, often occur when the bias circuit impedance will support such an oscillation.

The bias signal applied to avalanche devices, and in particular to high voltage swing devices, such as TRAPATT diodes, has typically been of a pulse nature to provide for power dissipation. The output signal of the device is accordingly of a similar pulse nature. Such bias pulses are typically generated by a high internal resistance constant current source driven by a pulse generator. The high internal resistance of the current source, typically in the order of 100KΩ, typically controls the resistance of the bias circuit. In previous practice, particularly with large voltage swing devices, the bias pulses have been in the order of one-half microsecond, much shorter than the time for one-half a cycle of the spurious sub-microwave oscillations. Accordingly, the effects of such spurious oscillations have not been apparent in typical prior art circuits utilizing large voltage swing devices. However, in some applications, for example in phased array radar, it is desirable to increase the pulse width of the bias signal to, for example, 50 microseconds or longer. Such pulse widths are longer than one-half cycle of the spurious oscillations, and accordingly, the effects of the spurious signals are manifested, typically rendering the system inoperable, and in some instances causing the avalanche device to burn out.

The problem of spurious sub-microwave negative resistance oscillations in low voltage swing IMPATT oscillators has been addressed in U.S. Pat. No. 3,792,375 issued Feb. 12, 1974 to C. A. Brackett. The Brackett oscillators utilize a resistive network coupled in series between the bias line and the IMPATT diode. Such an arrangement, however, as will be explained below, would be ineffective in a circuit utilizing a high voltage swing avalanche device, such as, for example, a TRAPATT diode, which, as will be also explained, generates spurious relaxation oscillations at frequencies much lower than those generated in low voltage swing circuits.

SUMMARY OF THE INVENTION

The present invention is directed to an improvement in a bias circuit for a large voltage swing avalanche device having a negative resistance characteristic at spurious subharmonic frequencies. The bias circuit comprises a power supply coupled to the device through a bias line and a resistive network. The improvement comprises the resistive network being shunted across the bias line and ground, whereby the impedance of the bias circuit is mismatched to the negative resistance at the sub-microwave frequencies to prevent thereby spurious sub-microwave negative resistance oscillations. Further, the resistance of the bias circuit is lessened to prevent thereby spurious low frequency relaxation oscillation.

BRIEF DESCRIPTION OF THE DRAWING

The sole FIGURE of the drawing is a schematic block diagram of a TRAPATT amplifier in accordance with the present invention.

DESCRIPTION OF A PREFERRED EMBODIMENT

Referring to the drawing, a bias circuit 10 is coupled through a suitable bias line 12 to a d.c. bias terminal 14 of a high voltage swing TRAPATT amplifier 16. Bias circuit 10 comprises a conventional constant current source 18 driven by a conventional pulse generator 20. Bias circuit 10, in accordance with the present invention, further comprises a resistive network 22, preferably a serially connected resistor 24 and capacitor 26, shunted across bias line 12 to ground. Bias line 12 may be any suitable transmission line, such as, for example, microstrip or coaxial cable. For a description of a suitable constant current source 18, reference is made to the current limiting circuit described in U.S. Pat. No. 3,917,980, "Protection Circuit" issued Nov. 4, 1975 to S. Weisbrod. Such current limiting circuit comprises a Zener diode, an N-P-N transistor and a resistor. The cathode and anode of the Zener diode are respectively coupled to the base of the transistor, and the anode to one terminal of the resistor, the other terminal of the resistor being coupled to the emitter of the transistor. The base of the transistor is coupled, through a second resistor to ground. Pulses from pulse generator 20 are applied to the juncture between the Zener diode and resistor, and the collector of the transistor provides the bias signal to bias line 12. The internal resistance of such current sources are high, in the order of 100KΩ or higher. Pulse generator 20 is suitably a Velonex type 350 High Power Pulse Generator.

TRAPATT amplifier 16 may be of the type described in U.S. Pat. No. 3,848,196 issued Nov. 12, 1974 to H. Kawamoto, E. Allen and S. Weisbrod. Briefly, amplifier 16 comprises a TRAPATT diode 28, connected in a plurality of 50Ω transmission line sections generally indicated as 30 and 32. Transmission line sections 30 and 32 are tuned by tuning plates 33 and are terminated through blocking capacitors 34 and 50-ohm impedance terminations 36. The bias signal from bias circuit 10 is applied, to bias terminal 14 and therefrom through an inductor 38 to transmission line 30.

The operation of avalanche diode amplifier 16 at microwave frequencies is detailed in the aforementioned U.S. Pat. No. 3,848,196. Briefly, when amplifier 16 is tuned for broad bandwidth, diode 28 is not perfectly matched to the biasing circuit at a given frequency, and the avalanche diode tends to go into an undesired, low frequency relaxation oscillation mode, as is hereinafter explained. When the voltage across the diode 28 builds up to a threshold (avalanche breakdown) level, avalanche breakdown occurs, collapsing the voltage across the diode to nearly zero volts. Assuming that the recovery RC time constant is long such that a low-frequency relaxation oscillation is sustained, as will be explained, the voltage across diode 28 gradually "builds up" until the breakdown threshold level is again reached, whereupon avalanche breakdown reoccurs and the cycle is repeated. The change in voltage levels across the avalanche device from the breakdown threshold level to the voltage level after breakdown, is herein termed the "voltage swing" of the circuit. Such a process is analogous to relaxation oscillation, occurring in, for example, the operation of neon lights. The time required for the voltage across the device to recover to the avalanche threshold level after the occurrence of avalanche breakdown, termed the "recovery time" of the circuit, is proportional to the magnitude of the voltage swing across the avalanche device, and the RC time constant of the circuit. The frequency of the relaxation oscillation is equal to the inverse of the sum of the recovery time plus the time required for the voltage across the diode to collapse.

In large voltage swing circuits, such as those utilizing TRAPATT devices, voltage swings of 150 volts are typical, as compared to voltage swings typically in the range of two volts for small voltage swing avalanche device circuits. In addition, the capacitance of large swing devices such as TRAPATT devices, is typically in the order of twenty times the capacitance of small voltage swing devices. The resistance in the prior art circuits, as noted above, is essentially equal to the high internal resistance (100K) of current source 18. Thus, a high voltage swing circuit has a much longer recovery time and therefore, generates a relaxation oscillation at a much lower frequency, in the order of kiloHertz, than the frequency of relaxation oscillations, in the order of megaHertz, typically generated in small voltage swing circuits.

In small voltage swing circuits, a resistive network serially connected between the bias line and the avalanche device, such as described in the aforementioned Brackett patent, will operate to dampen spurious subharmonic negative resistance oscillations. In addition, in a small voltage swing circuit, the relaxation oscillation generated with such a series resistance, are at frequencies, which are effectively blocked by inductor 38 and terminations 36. However, in large voltage swing circuits, higher capacitance of the diode, in cooperation with the high internal resistance of current source 18 causes the time constant of the circuit to be high, producing relaxation oscillations at frequencies (KH$_z$) below the blocking range of inductor 38. It is impractical to change the impedance of inductor 38 to a value capable of blocking the low frequency (KH$_z$) relaxation oscillations in that inductor 38 would become physically too bulky for many applications. A resistance coupled in series with diode 28 and current source 18, while possibly effective to dampen sub-microwave negative resistance oscillation, is ineffective to stop relaxation oscillations in view of the high resistance of current source 18. Moreover, if the added series resistance has any appreciable effect on the generation of relaxation oscillations, it operates to produce oscillations at even lower frequencies.

In accordance with the present invention, spurious low frequency oscillation due to negative resistance of the avalanche device at sub-microwave frequencies is attenuated without producing spurious low frequency relaxation oscillations, by shunting resistance network 22 across bias line 12 to ground. Resistive network 22, in combination with current source 18, operates to dampen sub-microwave negative resistance oscillations, by presenting a mismatched load to the diode. By inserting resistive network 22 in parallel with diode 28 and current source 18, rather than in series as in the prior art, the time constant of the circuit is determined essentially by resistor 24 rather than by the high internal resistance of current source 18. Resistor 24 is chosen such that the time constant of the circuit is comparable to the small swing circuit time constants, or smaller. Thus, the relaxation oscillation frequencies, in the order of megaHertz are well within the blocking range of inductor 38, and are dampened by inductor 38 and terminations 36. Capacitor 24 prevents DC power dissipation in resistor 24.

A TRAPATT amplifier, such as described in the above-mentioned U.S. Pat. No. 3,848,196, has been operated utilizing a biasing circuit 10 in accordance with the present invention, wherein resistor 24 had a value of 110Ω and capacitor 26 had a value of 4300 pF. Such amplifier was operated with 50 microsecond pulsewidth output pulses. The RF output of the amplifier was free from the observable noise on the detected RF waveform over a bandwidth of 325 MHz. The same amplifier utilizing a conventional bias source or bias source such as described in the aforementioned U.S. Pat. No. 3,792,375 was capable of generating output pulses of no more than 5 microsecond duration. In addition, spurious oscillation was superimposed on the 5 microsecond pulse.

It should be apparent from the foregoing description that the present invention provides for a significant advance in wide pulsewidth operation of large voltage swing devices.

What is claimed is:

1. In a bias circuit for a large voltage swing avalanche device, said bias circuit being of the type having a resistance comprising a power supply coupled to a bias line, said bias line being coupled to said diode through an inductor and an impedance network means including a resistor, said device having a negative resistance characteristic at spurious sub-microwave frequencies, the improvement wherein:

said impedance network means is shunted across said bias line and ground, the resistive component of said impedance network means being chosen such that the impedance of said bias circuit is mismatched to said negative resistance of said device at said spurious sub-microwave frequencies, to prevent thereby spurious sub-microwave negative resistance oscillations, and further, such that the resistance of said bias circuit is lowered, to prevent thereby spurious low frequency relaxation oscillation to provide thereby for large voltage swing avalanche operation of said device for periods longer than a substantial portion of one cycle of said spurious oscillations.

2. The circuit of claim 1 wherein said impedance network means comprises a serially connected resistor and capacitor.

3. The circuit of claim 1 wherein said avalanche device is a TRAPATT diode.

4. The circuit of claim 3 wherein said impedance network means comprises a serially connected resistor and capacitor.

* * * * *